(12) United States Patent
Chang et al.

(10) Patent No.: US 10,424,873 B1
(45) Date of Patent: Sep. 24, 2019

(54) ELECTRICAL CONNECTOR AND CIRCUIT BOARD THEREOF

(71) Applicants: U.D.ELECTRONIC CORP, Taoyuan (TW); U.D.(DONGGUAN)ELECTRONIC TECHNOLOGY CORP., Dongguan, Guangdong Province (CN); U.D.(ZHONG JIANG)ELECTRONIC CORP., Deyang, Sichuan Province (CN)

(72) Inventors: Chih-Kai Chang, Taoyuan (TW); Yao-Ching Huang, Taoyuan (TW); Shih-Hung Chang, Taoyuan (TW)

(73) Assignees: U.D.ELECTRONIC CORP, Taoyuan (TW); U.D.(DONGGUAN)ELECTRONIC TECHNOLOGY CORP., Dongguan, Guangdong Province (CN); U.D.(ZHONG JIANG)ELECTRONIC CORP., Deyang, Sichuan Province (CN)

( * ) Notice: Subject to any disclaimer, the term of this patent is extended or adjusted under 35 U.S.C. 154(b) by 0 days.

(21) Appl. No.: 16/132,611

(22) Filed: Sep. 17, 2018

(51) Int. Cl.
*H01R 13/6466* (2011.01)
*H01R 13/66* (2006.01)
(Continued)

(52) U.S. Cl.
CPC ......... *H01R 13/6466* (2013.01); *H01R 13/22* (2013.01); *H01R 13/40* (2013.01); *H01R 13/6625* (2013.01); *H01R 13/6658* (2013.01)

(58) Field of Classification Search
CPC ............ H01R 13/7195; H01R 13/6625; H01R 13/6466; H01R 13/6658; H01R 13/22; H01R 13/40
(Continued)

(56) References Cited

U.S. PATENT DOCUMENTS 4,126,840 A * 11/1978 Selvin ................. H01R 13/7195
333/175
4,741,710 A * 5/1988 Hogan ............... H01R 13/7195
333/185

(Continued)

*Primary Examiner* — Gary F Paumen
(74) *Attorney, Agent, or Firm* — Li & Cai Intellectual Property (USA) Office

(57) ABSTRACT

A circuit board of an electrical connector includes two adjacent first touching contacts, two second touching contacts respectively arranged at two opposite outer sides of the two first touching contacts, a plurality of conductive circuits connected to the first and second touching contacts, a first layer-like capacitor, and a second layer-like capacitor, the latter two of which are embedded therein. The first layer-like capacitor includes two coplanar first comb-like portions spaced apart from each other. The second layer-like capacitor includes two coplanar second comb-like portions spaced apart from each other. The two first comb-like portions are respectively and electrically coupled to one of the two first touching contacts and one of the two second touching contacts, which are arranged away from each other. The two second comb-like portions are respectively and electrically coupled to the other first touching contact and the other second touching contact.

20 Claims, 12 Drawing Sheets

(51) Int. Cl.
*H01R 13/22* (2006.01)
*H01R 13/40* (2006.01)

(58) Field of Classification Search
USPC .......................... 439/620.09–620.12, 620.14
See application file for complete search history.

(56) References Cited

U.S. PATENT DOCUMENTS

| | | | | |
|---|---|---|---|---|
| 4,950,185 | A * | 8/1990 | Boutros | H01R 13/7195 333/183 |
| 5,268,810 | A * | 12/1993 | DiMarco | H01R 13/7195 333/182 |
| 6,293,817 | B1 * | 9/2001 | Hamren | G01R 1/0416 439/482 |
| 6,950,298 | B2 * | 9/2005 | Edwards | H01R 13/2421 333/185 |
| 8,353,723 | B2 * | 1/2013 | Heckmann | A61F 2/4081 439/620.11 |
| 2002/0151220 | A1 * | 10/2002 | Dingenotto | H01R 13/7195 439/620.14 |
| 2003/0139096 | A1 * | 7/2003 | Stevenson | A61N 1/3754 333/182 |
| 2010/0136835 | A1 * | 6/2010 | Hashim | H05K 1/0228 439/620.22 |
| 2018/0178016 | A1 * | 6/2018 | Frustaci | A61N 1/3754 |

\* cited by examiner

ELECTRICAL CONNECTOR AND CIRCUIT BOARD THEREOF

FIELD OF THE DISCLOSURE

The present disclosure relates to a connector, and more particularly to an electrical connector and a circuit board thereof.

BACKGROUND OF THE DISCLOSURE

Crosstalk interference can be produced when transmitting differential signals with a conventional electrical connector. One of the important topics in the related art is how the crosstalk interference can be reduced while having the electrical connector remain small in size. In other words, the means for reducing crosstalk needs to be implemented in a very limited space for satisfying ever-changing design requirements.

SUMMARY OF THE DISCLOSURE

In response to the above-referenced technical inadequacies, the present disclosure provides an electrical connector and a circuit board thereof to effectively improve the issues associated with conventional electrical connectors.

In one aspect, the present disclosure provides an electrical connector, which includes an insulating housing, a circuit board, a plurality of touching terminals, and a plurality of fixing terminals. The insulating housing is provided for being inserted with a mating connector. The circuit board is disposed in the insulating housing and includes a plurality of touching contacts, a plurality of fixing contacts, a plurality of conductive circuits, a first layer-like capacitor, and a second layer-like capacitor. The touching contacts are arranged in one side portion of the circuit board. The touching contacts include two first touching contacts for jointly transmitting a first differential signal and two second touching contacts for jointly transmitting a second differential signal. The two first touching contacts are arranged adjacent to each other, and the two second touching contacts are respectively arranged at two opposite outer sides of the two first touching contacts. The fixing contacts are arranged in another side portion of the circuit board. Each of the conductive circuits has a first end and a second end opposite to the first end. The first ends of the conductive circuits are respectively connected to the touching contacts, and the second ends of the conductive circuits are respectively connected to the fixing contacts. The first layer-like capacitor is embedded in the circuit board and has two first comb-like portions that are coplanar and are staggered with respect to each other. One of the two first touching contacts and one of the two second touching contacts, which are arranged away from each other, are respectively and electrically coupled to the two first comb-like portions. The second layer-like capacitor is embedded in the circuit board and has two second comb-like portions that are coplanar and are staggered with respect to each other. The other first touching contact and the other second touching contact, which are arranged away from each other, are respectively and electrically coupled to the two second comb-like portions. The touching terminals are disposed in the insulating housing and are respectively connected to the touching contacts. The touching terminals are configured to abut against the mating connector. The fixing terminals are fastened to the insulating housing and are respectively connected to the fixing contacts. The fixing terminals are respectively and electrically coupled to the touching terminals through the circuit board.

In certain embodiments, the touching contacts include two third touching contacts for jointly transmitting a third differential signal and two fourth touching contacts for jointly transmitting a fourth differential signal. The two third touching contacts are arranged at an outer side of the two second touching contacts, and the two fourth touching contacts are arranged at another outer side of the two second touching contacts. The circuit board includes a third layer-like capacitor and a fourth layer-like capacitor. The third layer-like capacitor is embedded in the circuit board and has two third comb-like portions that are coplanar and are staggered with respect to each other. One of the two third touching contacts and one of the two second touching contacts, which are away from the two fourth touching contacts, are respectively and electrically coupled to the two third comb-like portions. The fourth layer-like capacitor is embedded in the circuit board and has two fourth comb-like portions that are coplanar and are staggered with respect to each other. One of the two fourth touching contacts and the other second touching contact, which are away from the two third touching contacts, are respectively and electrically coupled to the two fourth comb-like portions.

In one aspect, the present disclosure provides a circuit board of an electrical connector that is provided without any capacitor disposed on a board surface thereof. The circuit board is disposed in the insulating housing and includes a plurality of touching contacts, a plurality of fixing contacts, a plurality of conductive circuits, a first layer-like capacitor, and a second layer-like capacitor. The touching contacts are arranged in one side portion of the circuit board. The touching contacts include two first touching contacts for jointly transmitting a first differential signal and two second touching contacts for jointly transmitting a second differential signal. The two first touching contacts are arranged adjacent to each other, and the two second touching contacts are respectively arranged at two opposite outer sides of the two first touching contacts. The fixing contacts are arranged in another side portion of the circuit board. Each of the conductive circuits has a first end and a second end opposite to the first end. The first ends of the conductive circuits are respectively connected to the touching contacts, and the second ends of the conductive circuits are respectively connected to the fixing contacts. The first layer-like capacitor is embedded in the circuit board and has two first comb-like portions that are coplanar and are staggered with respect to each other. One of the two first touching contacts and one of the two second touching contacts, which are arranged away from each other, are respectively and electrically coupled to the two first comb-like portions. The second layer-like capacitor is embedded in the circuit board and has two second comb-like portions that are coplanar and are staggered with respect to each other. The other first touching contact and the other second touching contact, which are arranged away from each other, are respectively and electrically coupled to the two second comb-like portions.

Therefore, in the electrical connector of the present disclosure, the first layer-like capacitor and the second layer-like capacitor are embedded in the circuit board so as to generate larger capacitance value, thus the cross-talk interference in the electrical connector can be effectively reduced under the premise that the size of the electrical connector (or the circuit board) is not increased. Moreover, each of the first layer-like capacitor and the second layer-like capacitor in the present disclosure is formed with two comb-like portions staggered with respect to each other, so that the performance of the circuit board can be more stable, and the circuit board can be more easily manufactured.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
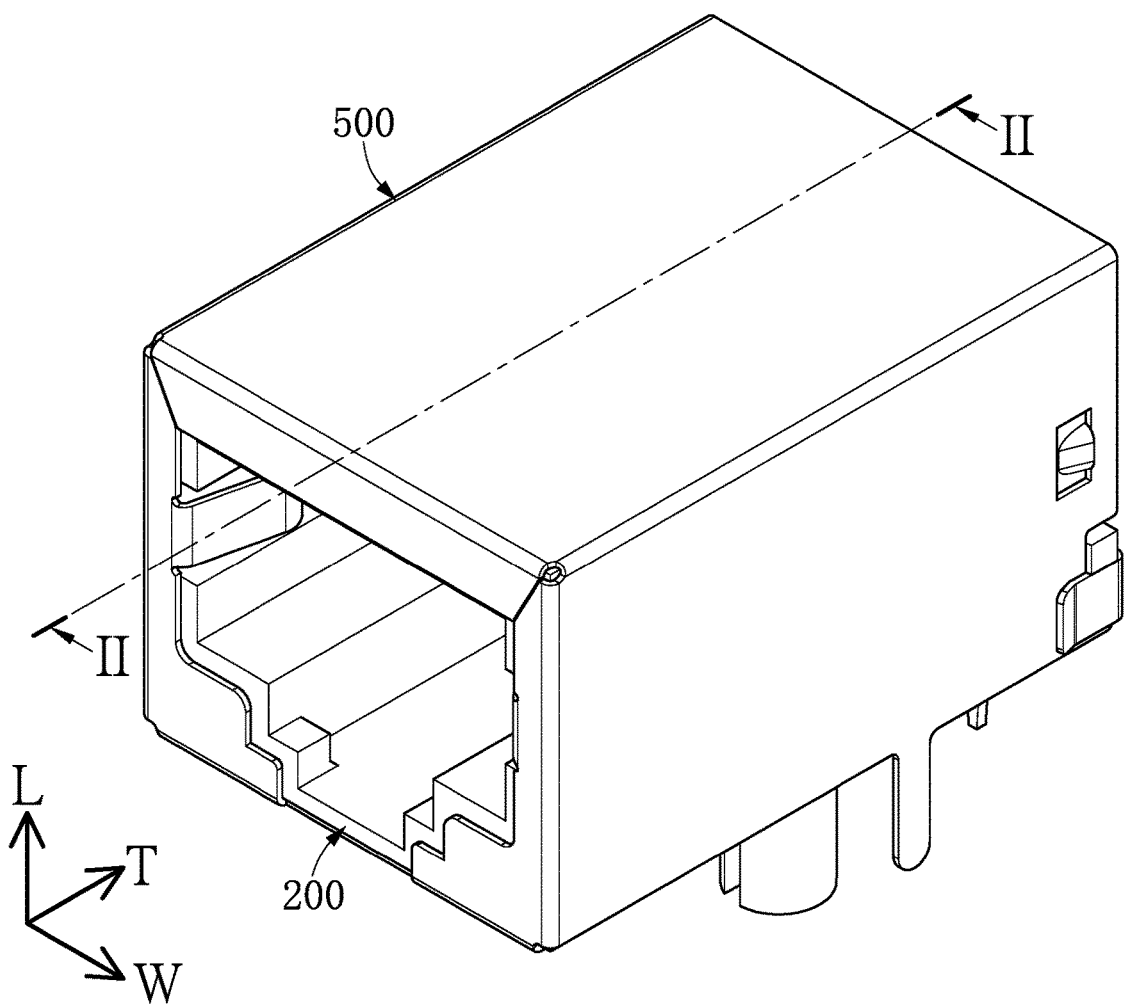
FIG. 1 is a perspective view of an electrical connector according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
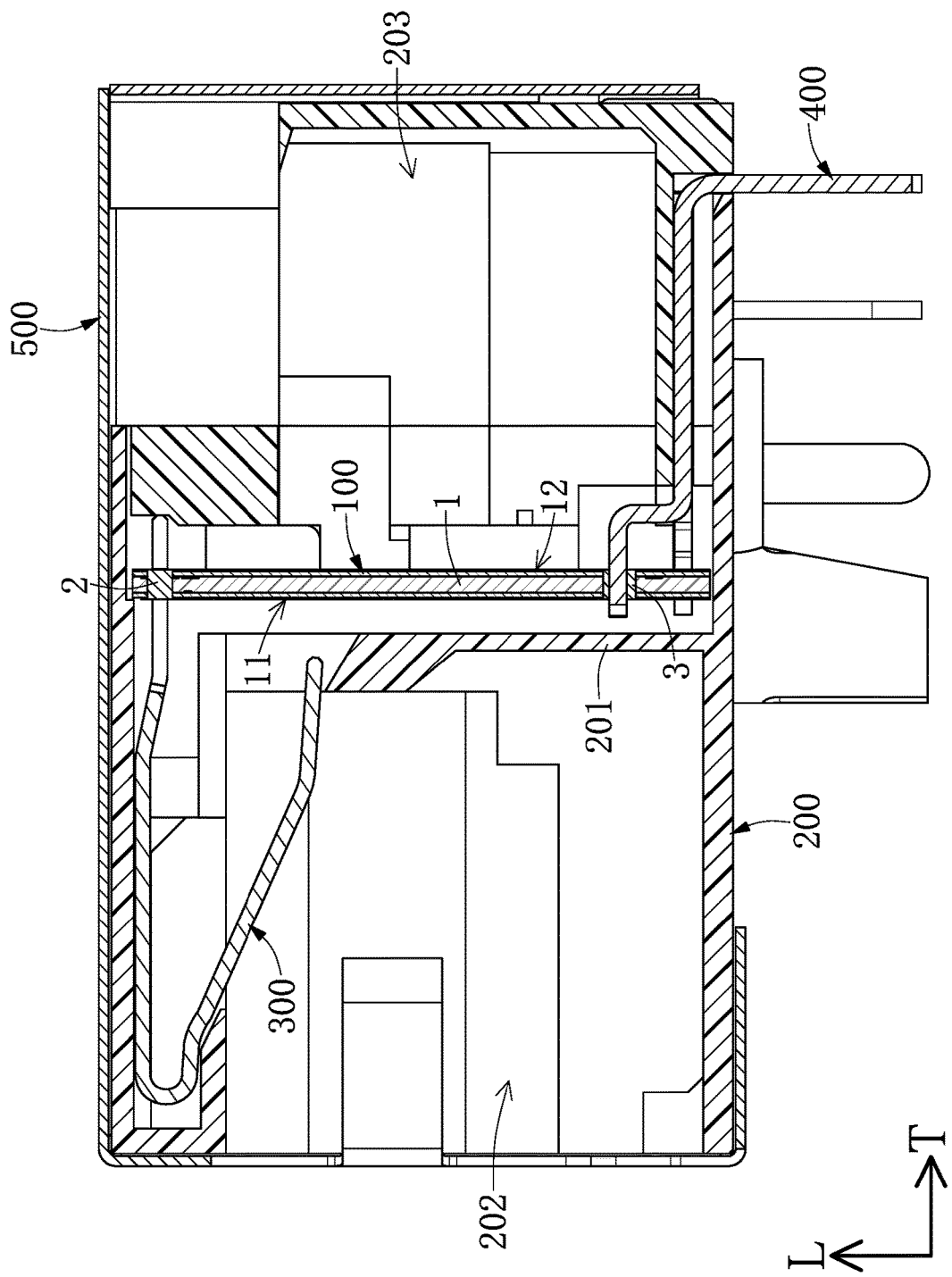
FIG. 2 is a cross-sectional view taken along line II-II of FIG. 1.
Figure 3:
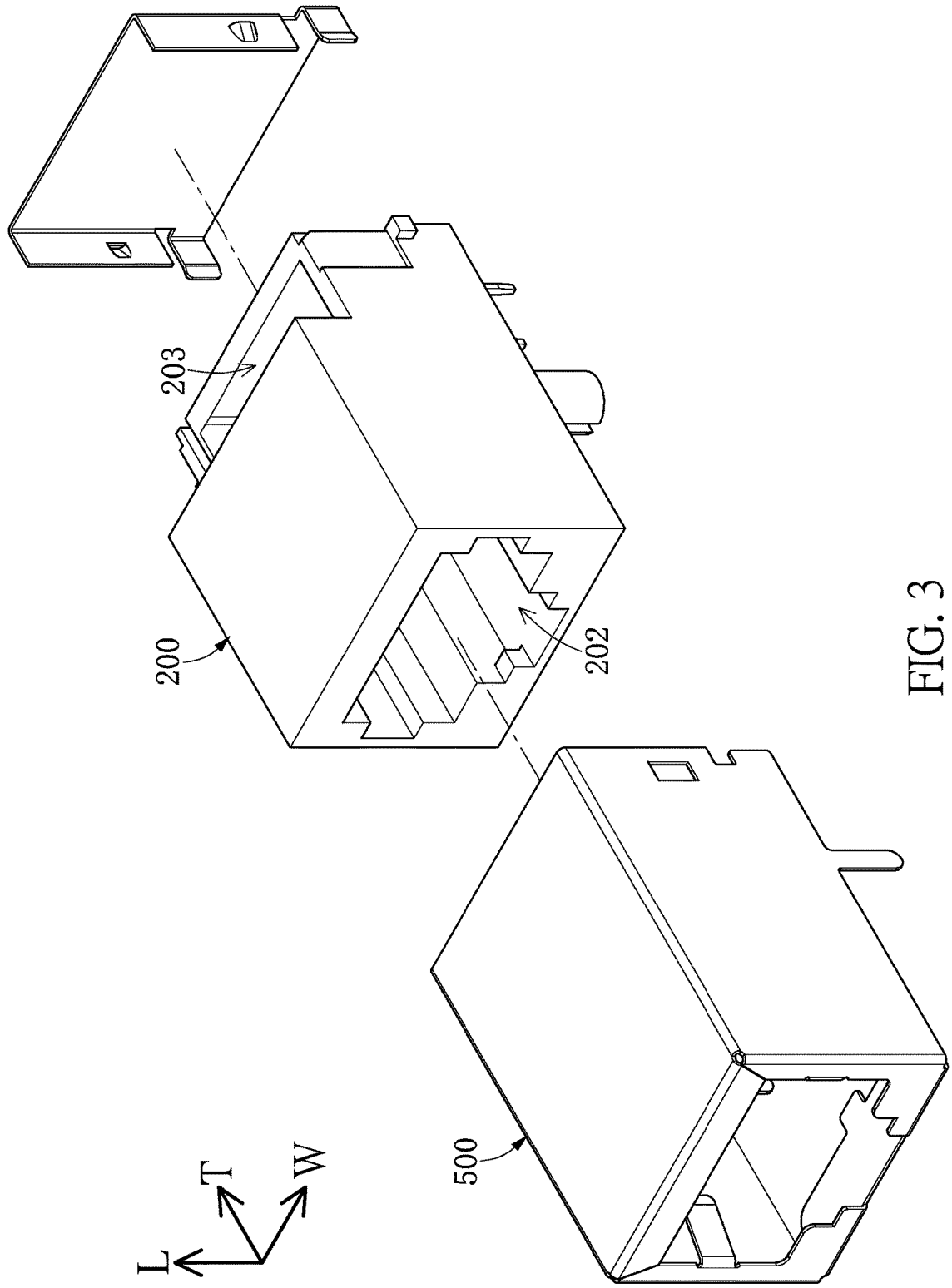
FIG. 3 is an exploded view of FIG. 1.

Referring to FIG. 1 to FIG. 12, an embodiment of the present disclosure provides an electrical connector that can be a communication connector (e.g., an RJ connector), but the present disclosure is not limited thereto. As shown in FIG. 1 to FIG. 3, the electrical connector includes an insulating housing 200, a circuit board 100 disposed in the insulating housing 200, a plurality of touching terminals 300 disposed in the insulating housing 200, a plurality of fixing terminals 400 fastened to the insulating housing 200, and a metallic shielding cover 500 covering an outer surface of the insulating housing 200.

It should be noted that the circuit board 100 of the present embodiment cooperates with the above components, and the electrical connector is preferably provided without any electronic component (e.g., a capacitor) disposed on a board surface of the circuit board 100, but the present disclosure is not limited thereto. For example, the circuit board 100 can be independently sold or can cooperate with other components. The following description discloses the structure and connection relationship of each component of the electrical connector of the present embodiment.

As shown in FIG. 2, the insulating housing 200 has a partition 201 arranged therein, and the insulating housing 200 can be divided into a front chamber 202 and a rear chamber 203 by the partition 201. An upper portion of the front chamber 202 is in spatial-communication with an upper portion of the rear chamber 203. That is to say, the upper portion of the front chamber 202 and the upper portion of the rear chamber 203 are not blocked by the partition 201. The front chamber 202 has an opening arranged away from the rear chamber 203 for providing a mating connector (not shown) to be inserted.

Figure 4:
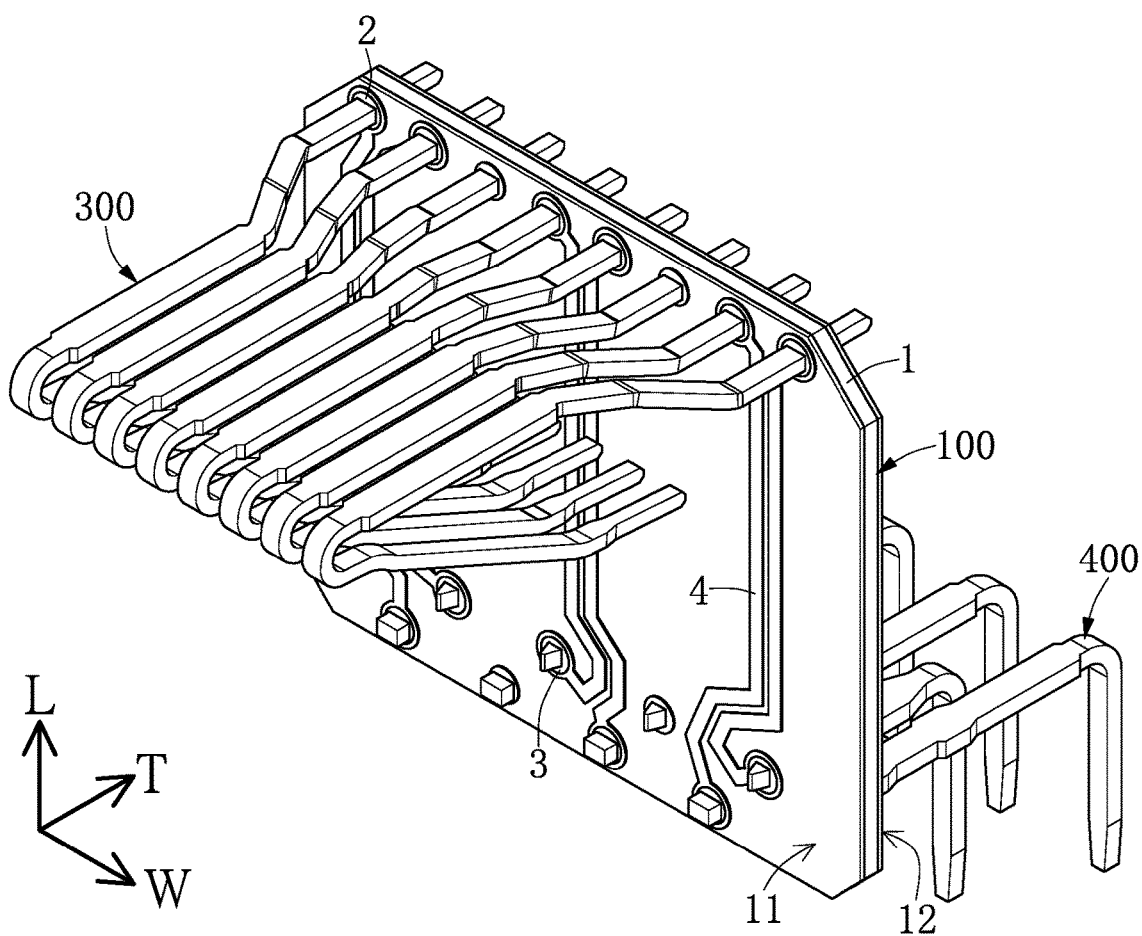
FIG. 4 is a perspective view showing a circuit board, touching terminals, and fixing terminals of the electrical connector according to the embodiment of the present disclosure.
Figure 5:
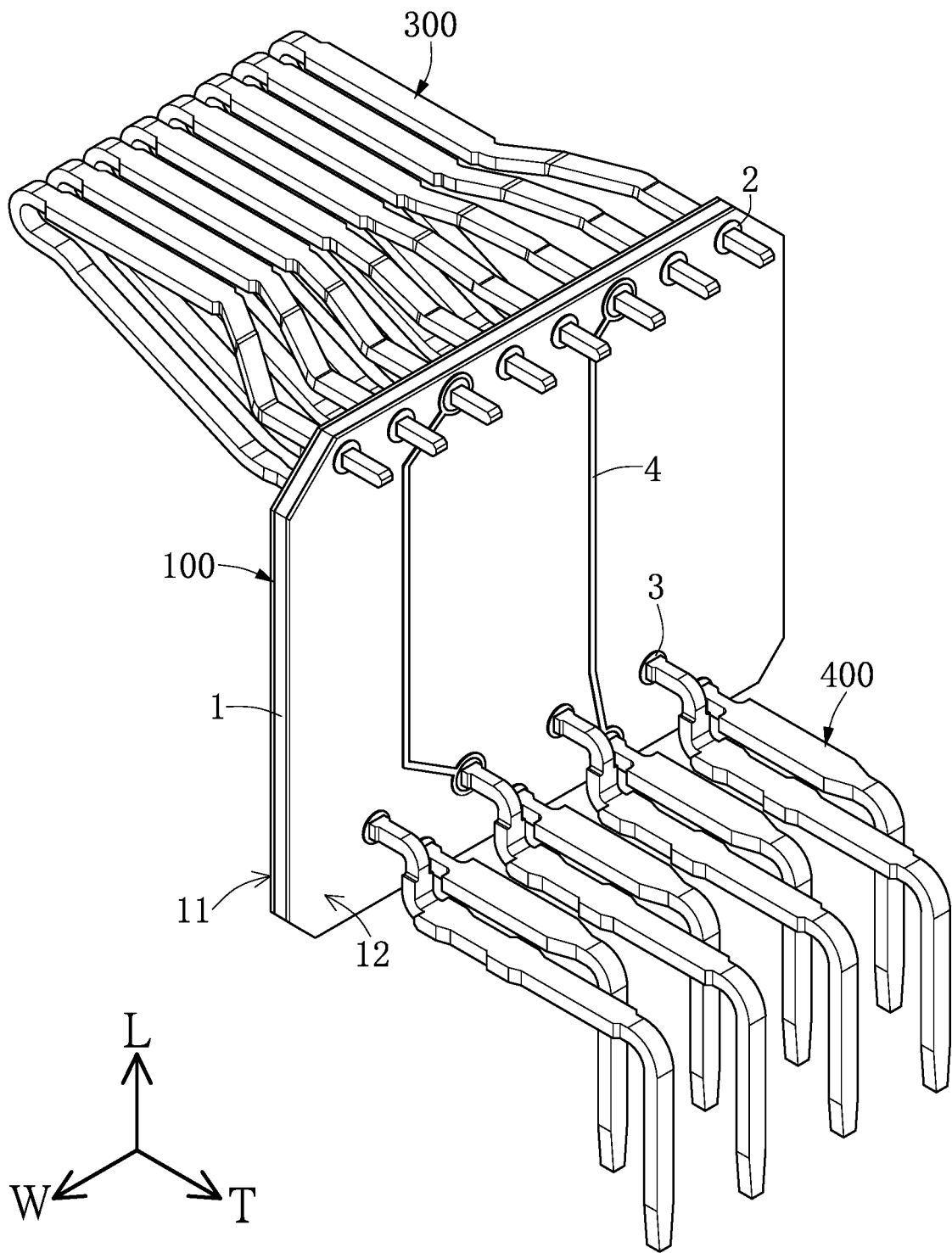
FIG. 5 is a perspective view of FIG. 4 in another angle of view.

As shown in FIG. 2, the circuit board 100 of the present embodiment is arranged in the rear chamber 203 of the insulating housing 200, and each board surface of the circuit board 100 is substantially parallel to the partition 201. Moreover, the drawings of the present embodiment do not show any anti-soldering layers formed on board surfaces of the circuit board 100 so as to easily describe the structure of the circuit board 100, but the present disclosure is not limited thereto. In other embodiments of the present disclosure, each board surface of the circuit board 100 can be covered with an anti-soldering layer. In addition, as shown in FIG. 4 to FIG. 6, the circuit board 100 of the present embodiment defines a longitudinal direction L, a width direction W, and a thickness direction T, which are orthogonal to each other, thereby more clearly describing the structure of the circuit board 100.

Figure 6:
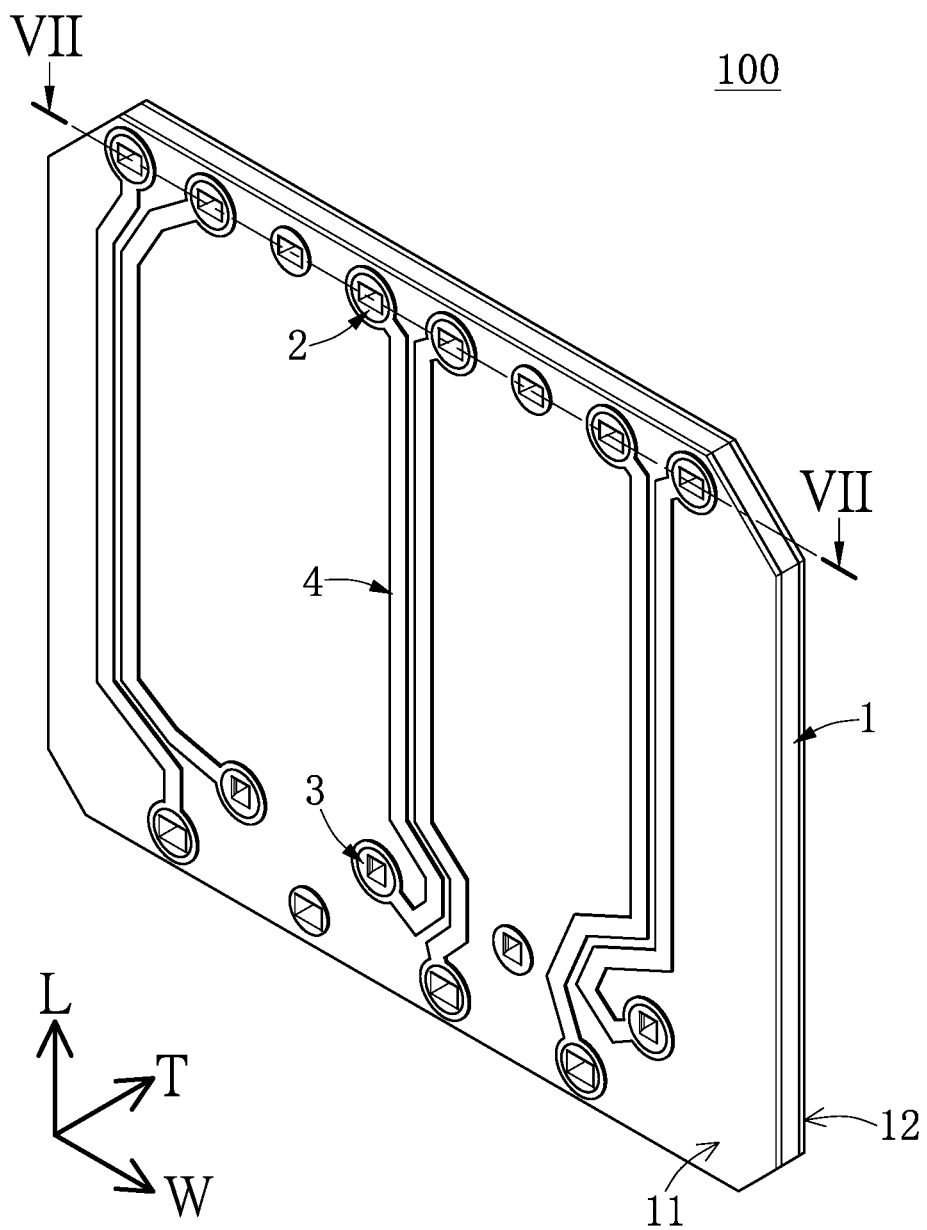
FIG. 6 is a perspective view showing the circuit board of the electrical connector according to the embodiment of the present disclosure.
Figure 7:
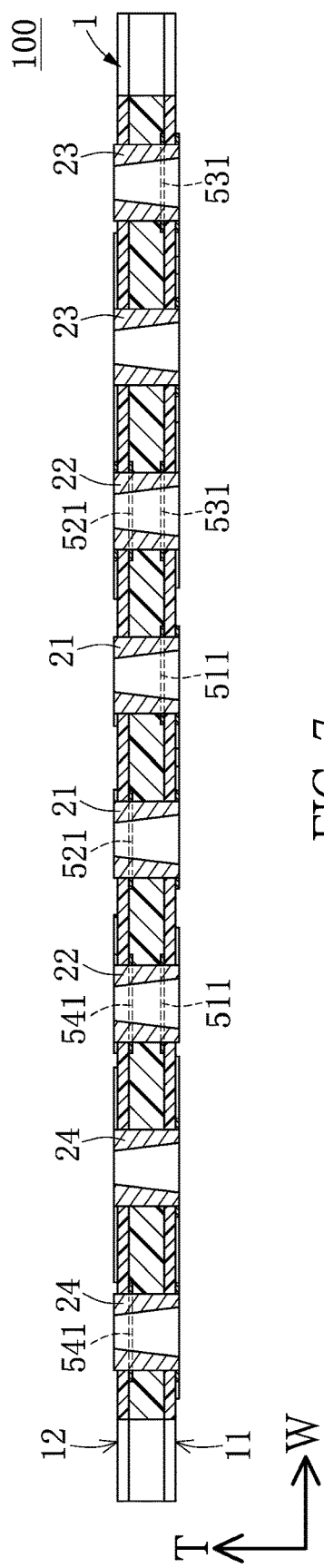
FIG. 7 is a cross-sectional view taken along line VII-VII of FIG. 6.
Figure 8:
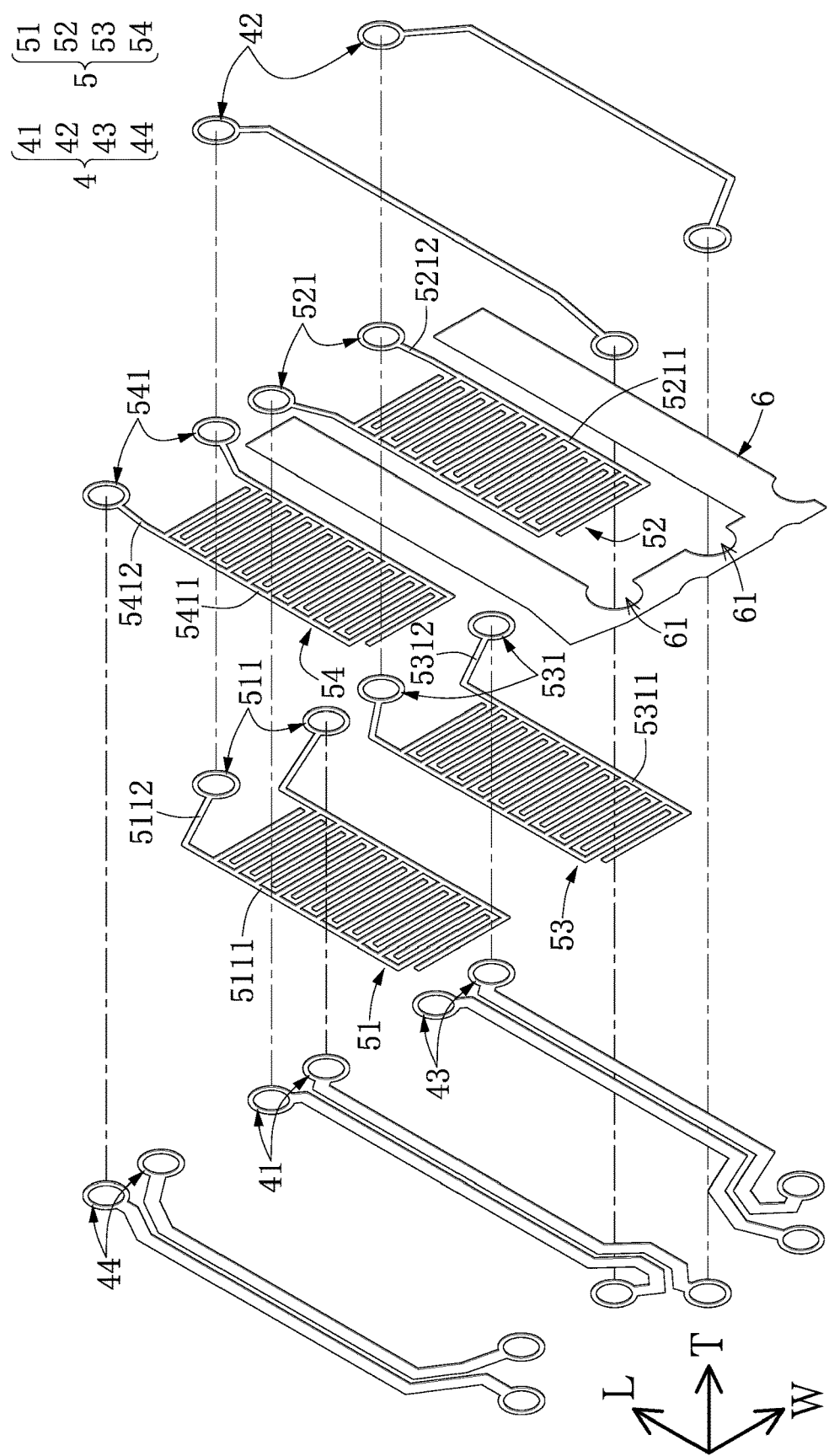
FIG. 8 is an exploded view of FIG. 6 that omits an insulating board, touching contacts, and fixing contacts.

As shown in FIG. 6 to FIG. 8, the circuit board 100 includes an insulating plate 1, a plurality of touching contacts 2 arranged in one side portion of the circuit board 100 (e.g., an upper portion of the circuit board 100 shown in FIG. 6), a plurality of fixing contacts 3 arranged in another side portion of the circuit board 100 (e.g., a lower portion of the circuit board 100 shown in FIG. 6), a plurality of conductive circuits 4 respectively connecting the touching contacts 2 to the fixing contacts 3, a plurality of layer-like capacitors 5 embedded in the circuit board 5, and a matching sheet 6 embedded in the circuit board 100.

It should be noted that the insulating plate 1 in the present embodiment is a multi-layer structure, and the conductive circuits 4 and the layer-like capacitors 5 can be arranged on different planes. In the present embodiment, the conductive circuits 4 are arranged in an outer layer of the insulating plate 1, and the layer-like capacitors 5 are arranged in an inner layer of the insulating plate 1, but the present disclosure is not limited thereto. Moreover, the insulating plate 1 has a first surface 11 and a second surface 12 opposite to the first surface 11.

As shown in FIG. 6 and FIG. 7, the touching contacts 2 in the present embodiment are arranged in one row along the width direction W, and each adjacent two of the touching contacts 2 have the same gap. Each of the touching contacts 2 is in a tubular shape and penetrates through the circuit board 100 along the thickness direction T so as to provide for insertion of the corresponding touching terminal 300, but the present disclosure is not limited thereto. Specifically, each of the touching contacts 2 is arranged in the insulating plate 1 along the thickness direction T, and has two ends respectively exposed from the first surface 11 and the second surface 12. In other embodiments of the present disclosure, the touching contact 2 and the corresponding touching terminal 300 can be detachably connected to each other, or can be soldered to each other in a surface mounting technology (SMT) manner.

Figure 9:
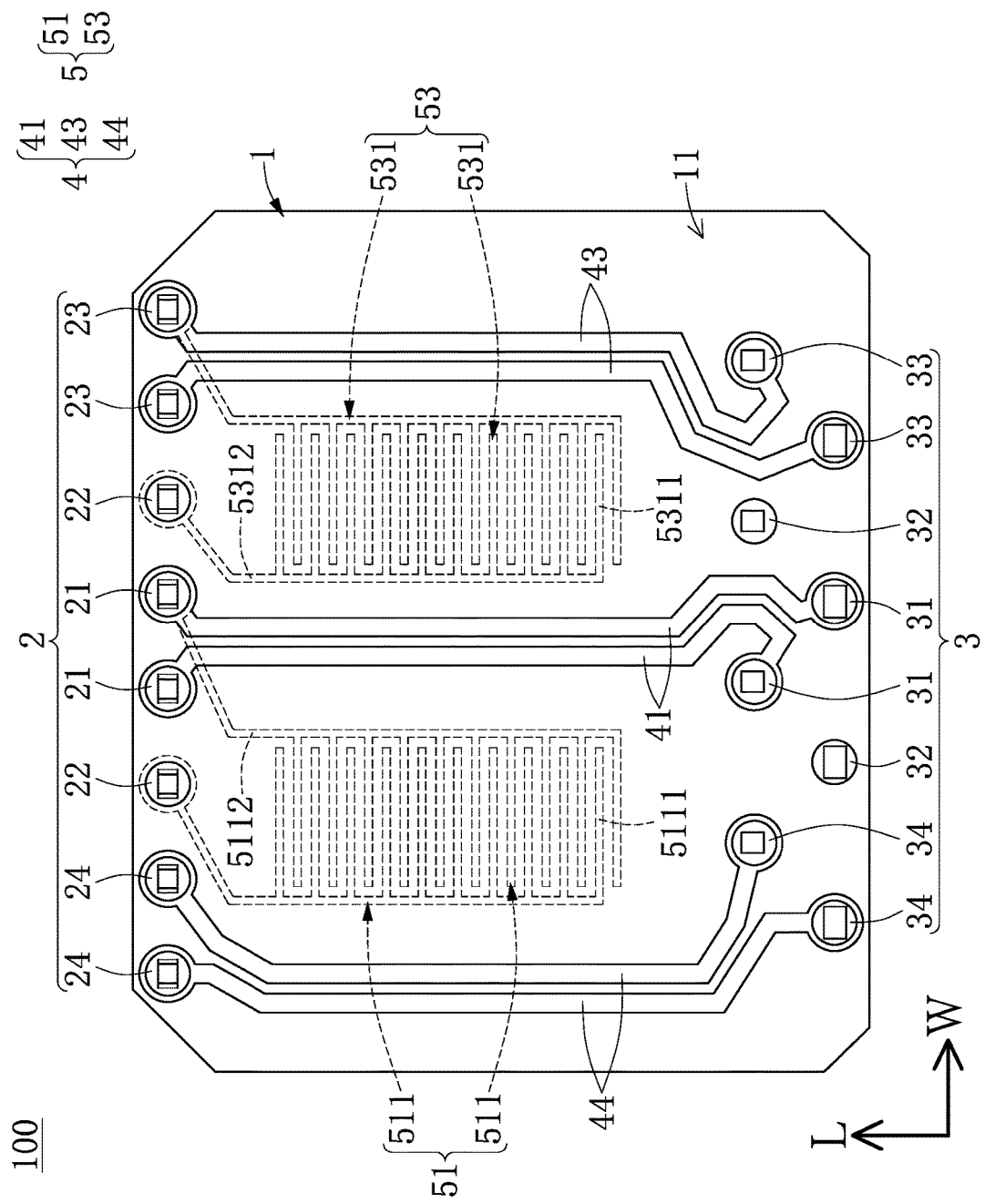
FIG. 9 is a front view of FIG. 6.

The touching contacts 2 in the present embodiment can be divided into four pairs according to signal transmission thereof. In other words, the four pairs of the touching contacts 2 are configured to respectively transmit different differential signals. As shown in FIG. 9, the plurality of (or the four pairs of) the touching contacts 2 include two (or a pair of) first touching contacts 21 for jointly transmitting a first differential signal, two (or a pair of) second touching contacts 22 for jointly transmitting a second differential signal, two (or a pair of) third touching contacts 23 for jointly transmitting a third differential signal, and two (or a pair of) fourth touching contacts 24 for jointly transmitting a fourth differential signal.

The two first touching contacts 21 are arranged adjacent to each other, and are respectively located at two middle positions of the touching contacts 2. The two second touching contacts 22 are respectively arranged at two opposite outer sides of the two first touching contacts 21 (e.g., the left side and the right side of the two first touching contacts 21 shown in FIG. 9). The two third touching contacts 23 are arranged at an outer side of the two second touching contacts 22 (e.g., the right side of the two second touching contacts 22 shown in FIG. 9), and the two fourth touching contacts 24 are arranged at another outer side of the two second touching contacts 22 (e.g., the left side of the two second touching contacts 22 shown in FIG. 9).

As shown in FIG. 9, the fixing contacts 3 in the present embodiment are arranged in two rows, and each of the two rows of the fixing contacts 3 is substantially parallel to the width direction W. Each of the fixing contacts 3 is in a tubular shape and penetrates through the circuit board 100 along the thickness direction T so as to provide insertion of the corresponding fixing terminal 400, but the present disclosure is not limited thereto. Specifically, each of the fixing contacts 3 is arranged in the insulating plate 1 along the thickness direction T, and has two ends respectively exposed from the first surface 11 and the second surface 12. In other embodiments of the present disclosure, the fixing contacts 3 and the corresponding fixing terminal 400 can be detachably connected to each other, or can be soldered to each other in a surface mounting technology (SMT) manner.

The fixing contacts 3 in the present embodiment can be divided into four pairs according to signal transmission thereof. In other words, the four pairs of the fixing contacts 3 are configured to respectively transmit different differential signals. As shown in FIG. 9, the plurality of (or the four pairs of) the fixing contacts 3 include two (or a pair of) first fixing contacts 31 for jointly transmitting the first differential signal, two (or a pair of) second fixing contacts 32 for jointly transmitting the second differential signal, two (or a pair of) third fixing contacts 33 for jointly transmitting the third differential signal, and two (or a pair of) fourth fixing contacts 34 for jointly transmitting the fourth differential signal.

The two first fixing contacts 31 are arranged adjacent to each other, and respectively face toward the two first touching contacts 21 along the longitudinal direction L. The two second fixing contacts 32 respectively face toward the two second touching contacts 22 substantially along the longitudinal direction L. The two third fixing contacts 33 respectively face toward the two third touching contacts 23 substantially along the longitudinal direction L. The two fourth fixing contacts 34 respectively face toward the two fourth touching contacts 24 substantially along the longitudinal direction L. Accordingly, the fixing contacts 3 in the present embodiment respectively face toward the touching contacts 2 substantially along the longitudinal direction L, but the relationship between the fixing contacts 3 and the touching contacts 2 of the present disclosure is not limited thereto.

Figure 11:
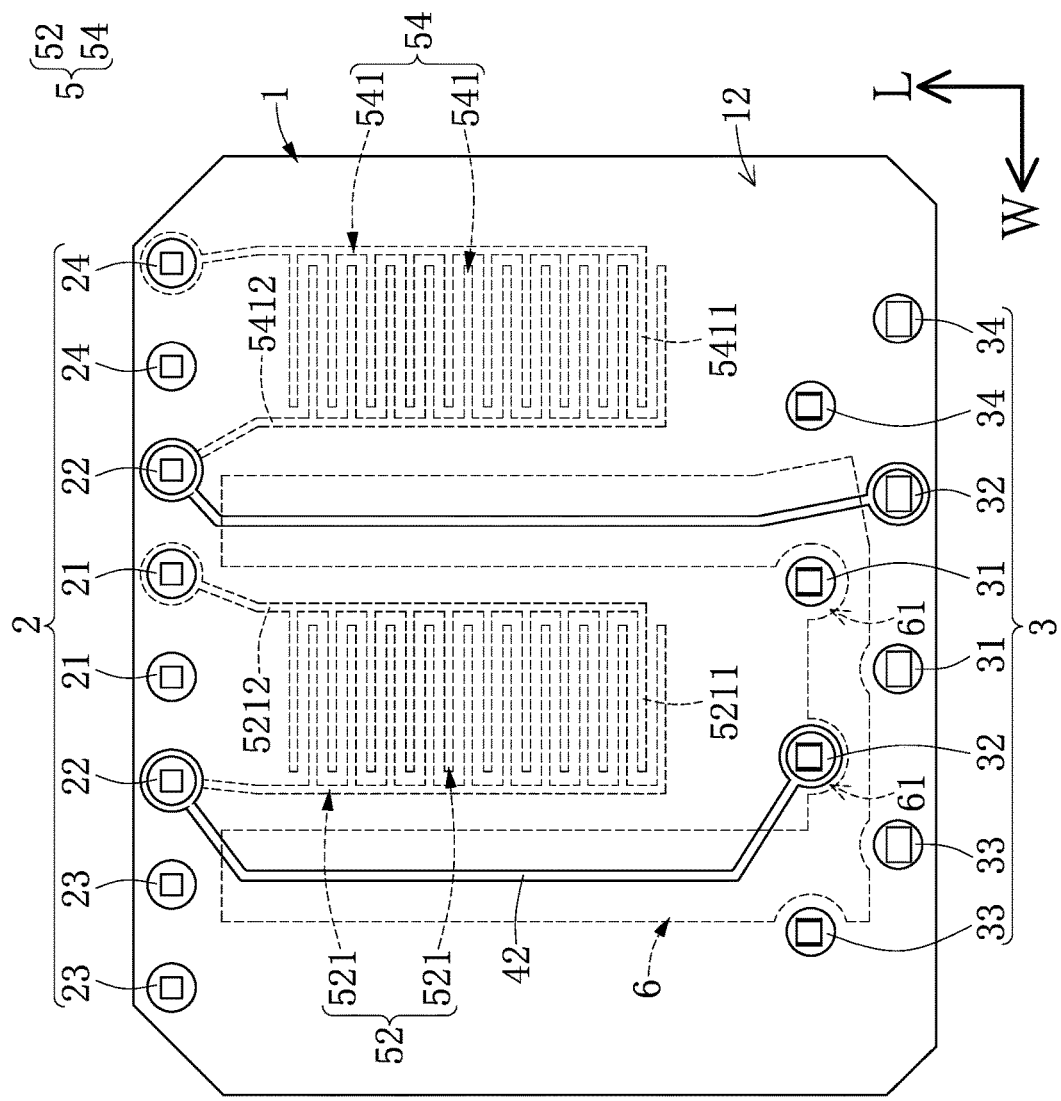
FIG. 11 is a rear view of FIG. 6.

As shown in FIG. 4 and FIG. 5, each of the conductive circuits 4 has a first end and a second end opposite to the first end. The first ends of the conductive circuits 4 (e.g., the top ends of the conductive circuits 4 shown in FIG. 4 and FIG. 5) are respectively connected to the touching contacts 2, and the second ends of the conductive circuits 4 (e.g., the bottom ends of the conductive circuits 4 shown in FIG. 4 and FIG. 5) are respectively connected to the fixing contacts 3. As shown in FIG. 9 and FIG. 11, the conductive circuits 4 include two first conductive circuits 42 respectively coupling the two first touching contacts 21 to the two first fixing contacts 31, two second conductive circuits 42 respectively coupling the two second touching contacts 22 to the two second fixing contacts 32, two third conductive circuits 43 respectively coupling the two third touching contacts 23 to the two third fixing contacts 33, and two fourth conductive circuits 44 respectively coupling the two fourth touching contacts 24 to the two fourth fixing contacts 34.

Specifically, as shown in FIG. 9 and FIG. 11, the two first conductive circuits 41, the two third conductive circuits 43, and the two fourth conductive circuits 44 in the present embodiment are formed on the first surface 11 of the insulating plate 1, and the two second conductive circuits 42 are formed on the second surface 12 of the insulating plate 1, but the present disclosure is not limited thereto.

As shown in FIG. 8 and FIG. 9, the layer-like capacitors 5 in the present embodiment are approximately of similar structures (e.g., each of the layer-like capacitors 5 has two comb-like portions that are coplanar and are staggered with respect to each other), so that the layer-like capacitor 5 in the present embodiment is not identical to a layer-like capacitor formed without two comb-like portions, and is different from a conventional capacitor component that can be independently implemented. In other embodiments of the present disclosure, the layer-like capacitors 5 can be structures that are not similar.

Moreover, the layer-like capacitors 5 in the present embodiment are embedded in the insulating plate 1, and a length of each of the comb-like portions (e.g., a first comb-like portion 511 disclosed in the following description) with respect to the longitudinal direction L is 50-85% of a distance between each of the touching contacts 2 and the corresponding fixing contact 3 (e.g., each of the two first touching contacts 21 and the corresponding first fixing contact 31).

Figure 10:
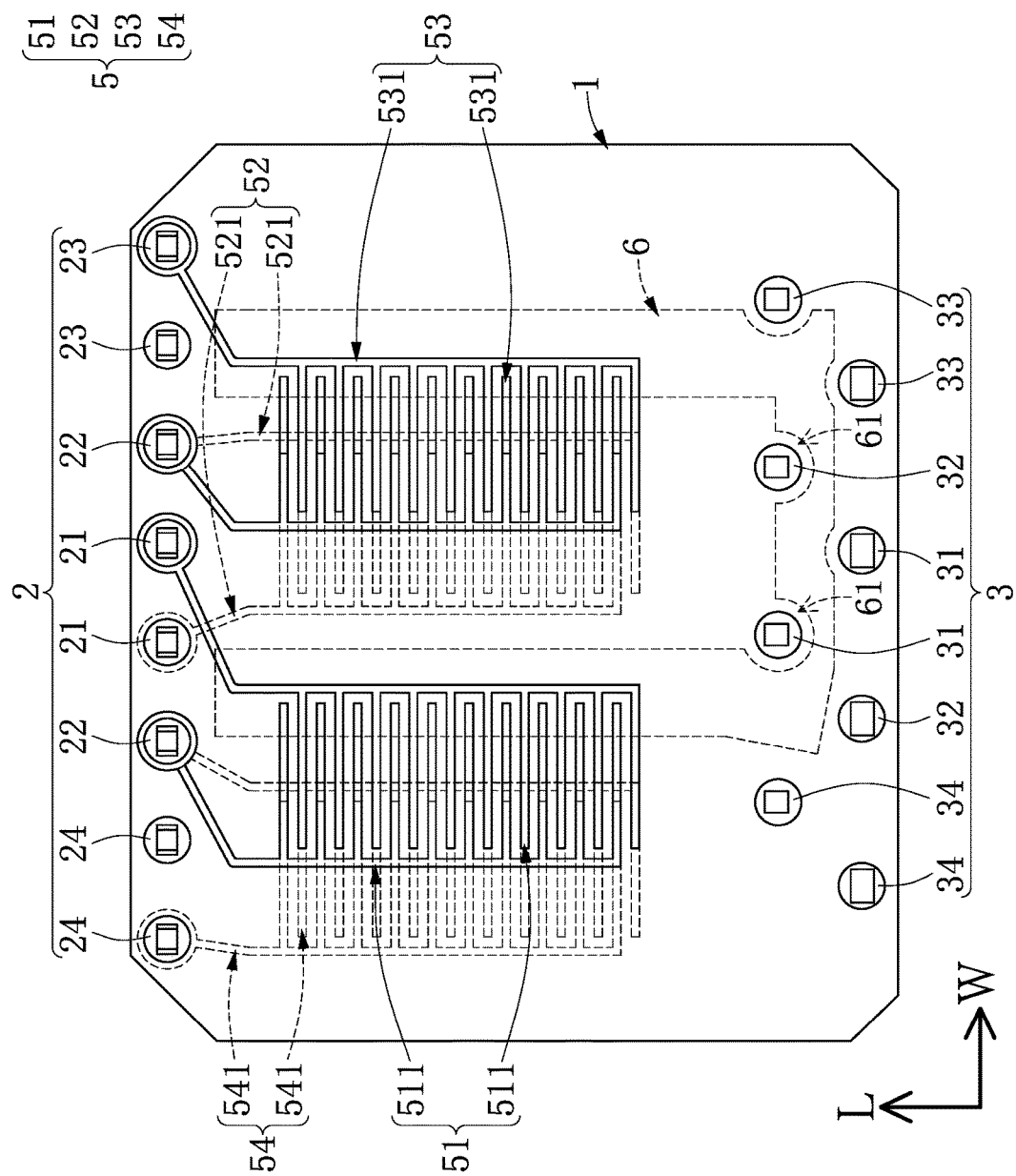
FIG. 10 is a partial view of FIG. 9 that omits a part of the insulating board and conductive circuits disposed thereon.

As shown in FIG. 9 and FIG. 10 (or FIG. 11 and FIG. 12), the layer-like capacitors 5 include a first layer-like capacitor 51, a second layer-like capacitor 52, a third layer-like capacitor 53 substantially coplanar with the first layer-like capacitor 51, and a fourth layer-like capacitor 54 substantially coplanar with the second layer-like capacitor 52. Moreover, the first layer-like capacitor 51 and the second layer-like capacitor 52 are respectively arranged on two different planes. The first layer-like capacitor 51 and the third layer-like capacitor 53 are arranged adjacent to the first surface 11 of the insulating plate 1, and the second layer-like capacitor 52 and the fourth layer-like capacitor 54 are arranged adjacent to the second surface 12 of the insulating plate 1. The following description discloses the connection relationship between the layer-like capacitors 5 and the other components of the circuit board 100.

As shown in FIG. 9 and FIG. 10, the first layer-like capacitor 51 has two first comb-like portions 511 that are coplanar and are staggered with respect to each other, and the second layer-like capacitor 52 has two second comb-like portions 521 that are coplanar and are staggered with respect to each other. Moreover, one of the two first touching contacts 21 and one of the two second touching contacts 22 (e.g., the third one and the fifth one of the touching contacts 2 counted from the left side to the right side shown in FIG. 10), which are arranged away from each other, are respectively and electrically coupled to the two first comb-like portions 511; the other first touching contact 21 and the other second touching contact 22 (e.g., the fourth one and the sixth one of the touching contacts 2 counted from the left side to the right side shown in FIG. 10), which are arranged away from each other, are respectively and electrically coupled to the two second comb-like portions 521.

Specifically, each of the two first comb-like portions 511 include a first comb-shaped segment 5111 and a first handle-shaped segment 5112 connected to the first comb-shaped segment 5111. The two first comb-shaped segments 5111 are spaced apart from each other and are staggered with respect to each other, and the two first handle-shaped segments 5112 are respectively connected to the corresponding first touching contact 21 and the corresponding second touching contact 22. In the present embodiment, the two first comb-like portions 511 are structurally connected to the corresponding first touching contact 21 and the corresponding second touching contact 22 so as to establish electrical connection there-between, but the present disclosure is not limited thereto.

Moreover, each of the two second comb-like portions 521 include a second comb-shaped segment 5211 and a second handle-shaped segment 5212 connected to the second comb-shaped segment 5211. The two second comb-shaped segments 5211 are spaced apart from each other and are staggered with respect to each other, and the two second handle-shaped segments 5212 are respectively connected to the corresponding first touching contact 21 and the corresponding second touching contact 22. In the present embodiment, the two second comb-like portions 521 are structurally connected to the corresponding first touching contact 21 and the corresponding second touching contact 22 so as to establish electrical connection there-between, but the present disclosure is not limited thereto.

As shown in FIG. 10, when the first layer-like capacitor 51 and the second layer-like capacitor 52 are orthogonally projected onto a board surface of the circuit board 100 along the thickness direction T, projected regions formed by the two first comb-shaped segments 5111 are spaced apart from projected regions formed by the two second comb-shaped segments 5211.

As shown in FIG. 9 and FIG. 10 (or FIG. 11 and FIG. 12), the third layer-like capacitor 53 has two third comb-like portions 531 that are coplanar and are staggered with respect to each other, and the fourth layer-like capacitor 54 has two fourth comb-like portions 541 that are coplanar and are staggered with respect to each other. Moreover, one of the two third touching contacts 23 and one of the two second touching contacts 22 (e.g., the sixth one and the eighth one of the touching contacts 2 counted from the left side to the right side shown in FIG. 10), which are away from the two fourth touching contacts 24, are respectively and electrically coupled to the two third comb-like portions 531; one of the two fourth touching contact 24 and the other second touching contact 22 (e.g., the first one and the third one of the touching contacts 2 counted from the left side to the right side shown in FIG. 10), which are away from the two third touching contacts 23, are respectively and electrically coupled to the two fourth comb-like portions 541.

Specifically, each of the two third comb-like portions 531 include a third comb-shaped segment 5311 and a third handle-shaped segment 5312 connected to the third comb-shaped segment 5311. The two third comb-shaped segments 5311 are spaced apart from each other and are staggered with respect to each other, and the two third handle-shaped segments 5312 are respectively connected to the corresponding third touching contact 23 and the corresponding second touching contact 22. In the present embodiment, the two third comb-like portions 531 are structurally connected to the corresponding third touching contact 23 and the corresponding second touching contact 22 so as to establish electrical connection there-between, but the present disclosure is not limited thereto.

Moreover, each of the two fourth comb-like portions 541 include a fourth comb-shaped segment 5411 and a fourth handle-shaped segment 5412 connected to the fourth comb-shaped segment 5411. The two fourth comb-shaped segments 5411 are spaced apart from each other and are staggered with respect to each other, and the two fourth handle-shaped segments 5412 are respectively connected to the corresponding fourth touching contact 24 and the corresponding second touching contact 22. In the present embodiment, the two fourth comb-like portions 541 are structurally connected to the corresponding fourth touching contact 41 and the corresponding second touching contact 22 so as to establish electrical connection there-between, but the present disclosure is not limited thereto.

As shown in FIG. 10, when the first layer-like capacitor 51 and the fourth layer-like capacitor 54 are orthogonally projected onto a board surface of the circuit board 100, a projected region formed by the first layer-like capacitor 51 overlaps a part of a projected region formed by the fourth layer-like capacitor 54. When the second layer-like capacitor 52 and the third layer-like capacitor 53 are orthogonally projected onto a board surface of the circuit board 100, a projected region formed by the second layer-like capacitor 52 overlaps a part of a projected region formed by the third layer-like capacitor 53.

Accordingly, the first layer-like capacitor 51 and the coplanar third layer-like capacitor 53 can be cooperated with the second layer-like capacitor 52 and the coplanar fourth layer-like capacitor 54 along the thickness direction T so as to generate a capacitance effect, thereby further reducing the cross-talk interference of the electrical connector.

In addition, as shown in FIG. 9, when the first layer-like capacitor 51 and the third layer-like capacitor 53 are orthogonally projected onto the first surface 11 of the insulating plate 1, projected regions formed by the two first comb-shaped segments 5111 and the two third comb-shaped segments 5311 are respectively located at two opposite outer sides of the two first conductive circuits 41 (e.g., the left side and the right side of the two first conductive circuits 41 shown in FIG. 9), and are located between the third conductive circuits 43 and the fourth conductive circuits 44.

Figure 12:
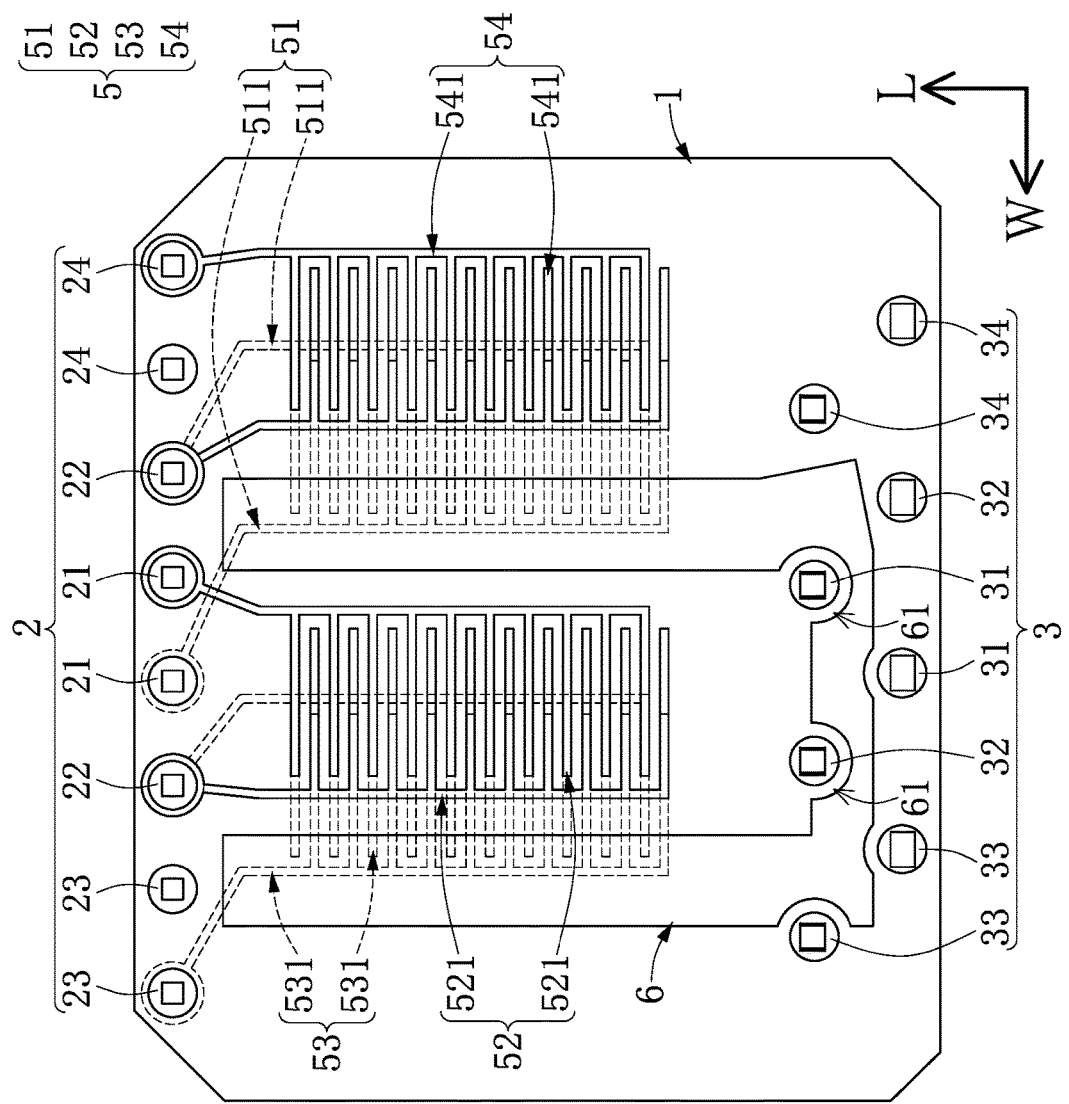
FIG. 12 is a partial view of FIG. 11 that omits a part of the insulating board and conductive circuits disposed thereon.

As shown in FIG. 11 and FIG. 12, the matching sheet 6 is embedded in the insulating plate 1 and is coplanar with the second layer-like capacitor 52 (and the fourth layer-like capacitor 54). The matching sheet 6 of the present embodiment is a U-shaped structure, the two second comb-shaped segments 5211 are entirely arranged inside of the matching sheet 6 (or the U-shaped structure), and are not in contact with the matching sheet 6.

Moreover, the matching sheet 6 has two notches 61 formed in an inner edge thereof. Two of the fixing contacts 3 respectively facing toward the first touching contact 21 and the second touching contact 22 that are connected to the second layer-like capacitor 52 (e.g., the third one and the fifth one of the fixing contacts 3 counted from the left side to the right side shown in FIG. 12) are respectively arranged in the two notches 61 of the matching sheet 6.

As shown in FIG. 11, when the matching sheet 6 and the conductive circuits 4 are orthogonally projected onto a board surface of the circuit board 100, a projected region formed by the matching sheet 6 overlaps at least 80% of projected regions formed by two of the conductive circuits 4 (e.g., the two first conductive circuits 41) that are respectively connected to the two first touching contacts 21.

Accordingly, the matching sheet 6 of the circuit board 100 is configured to adjust a capacitance value generated by the layer-like capacitors 5, and can be configured to more precisely control a capacitance value generated by the second layer-like capacitor 52, thereby effectively reducing the cross-talk interference of the electrical connector.

As shown in FIG. 4 and FIG. 5, the touching terminals 300 are respectively connected to the touching contacts 2 of the circuit board 100, and are configured to abut against the mating connector (not shown) that is inserted into the front chamber 202 of the electrical connector. Each of the touching terminals 300 in the present embodiment is substantially arranged in the front chamber 202. One ends of the touching terminals 300 are respectively inserted into and fixed in the touching contacts 2 from a front side of the circuit board 100, and the other ends of the touching terminals 300 are retained on the partition 201 of the insulating housing 200, so that each of the touching terminals 300 can be formed with a curved elastic portion in the front chamber 202 for abutting against the mating connector (not shown).

As shown in FIG. 4 and FIG. 5, the fixing terminals 400 are respectively connected to the fixing contacts 3 of the circuit board 100 for being fixed to an external circuit board (not shown). In the present embodiment, a part of each of the fixing terminals 400 is arranged in the rear chamber 203, and the other part of each of the fixing terminals 400 is arranged outside the insulating housing 200. One ends of the fixing terminals 400 are respectively inserted into and fixed in the fixing contacts 3 from a rear side of the circuit board 100, so that the fixing terminals 400 can be respectively and electrically coupled to the touching terminals 300 through the circuit board 100. Moreover, the other ends of the fixing terminals 400 are fixed on the external circuit board (not shown).

In conclusion, in the electrical connector of the present disclosure, the first layer-like capacitor 51 and the second layer-like capacitor 52 are embedded in the circuit board 100 so as to generate larger capacitance value, thus the cross-talk interference in the electrical connector can be effectively reduced under the premise that the size of the electrical connector (or the circuit board 100) is not increased. Moreover, each of the first layer-like capacitor 51 and the second layer-like capacitor 52 in the present disclosure is formed with two comb-like portions 511, 521 staggered with respect to each other, so that the performance of the circuit board 100 can be more stable, and the circuit board 100 can be manufactured more easily.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electrical connector, comprising:
   an insulating housing for being inserted with a mating connector;
   a circuit board disposed in the insulating housing and including:
      a plurality of touching contacts arranged in one side portion of the circuit board, wherein the touching contacts include two first touching contacts for jointly transmitting a first differential signal and two second touching contacts for jointly transmitting a second differential signal, and wherein the two first touching contacts are arranged adjacent to each other, and the two second touching contacts are respectively arranged at two opposite outer sides of the two first touching contacts;
      a plurality of fixing contacts arranged in another side portion of the circuit board;
      a plurality of conductive circuits each having a first end and a second end opposite to the first end, wherein the first ends of the conductive circuits are respectively connected to the touching contacts, and the second ends of the conductive circuits are respectively connected to the fixing contacts;
      a first layer-like capacitor embedded in the circuit board and having two first comb-like portions that are coplanar and are staggered with respect to each other, wherein one of the two first touching contacts and one of the two second touching contacts, which are arranged away from each other, are respectively and electrically coupled to the two first comb-like portions; and
      a second layer-like capacitor embedded in the circuit board and having two second comb-like portions that are coplanar and are staggered with respect to each other, wherein the other first touching contact and the other second touching contact, which are arranged away from each other, are respectively and electrically coupled to the two second comb-like portions; and a plurality of touching terminals disposed in the insulating housing and respectively connected to the touching contacts, wherein the touching terminals are configured to abut against the mating connector; and a plurality of fixing terminals fastened to the insulating housing and respectively connected to the fixing contacts, wherein the fixing terminals are respectively and electrically coupled to the touching terminals through the circuit board, wherein the touching contacts include two third touching contacts for jointly transmitting a third differential signal and two fourth touching contacts for jointly transmitting a fourth differential signal, the two third touching contacts are arranged at an outer side of the two second touching contacts, and the two fourth touching contacts are arranged at another outer side of the two second touching contacts, and wherein the circuit board includes:

a third layer-like capacitor embedded in the circuit board and having two third comb-like portions that are coplanar and are staggered with respect to each other, wherein one of the two third touching contacts and one of the two second touching contacts, which are away from the two fourth touching contacts, are respectively and electrically coupled to the two third comb-like portions; and a fourth layer-like capacitor embedded in the circuit board and having two fourth comb-like portions that are coplanar and are staggered with respect to each other, wherein one of the two fourth touching contacts and the other second touching contact, which are away from the two third touching contacts, are respectively and electrically coupled to the two fourth comb-like portions.

2. The electrical connector according to claim 1, wherein the circuit board includes an insulating plate, and the first layer-like capacitor and the second layer-like capacitor are embedded in the insulating plate and are respectively arranged on two different planes.

3. The electrical connector according to claim 1, wherein each of the two first comb-like portions include a first comb-shaped segment and a first handle-shaped segment connected to the first comb-shaped segment, the two first comb-shaped segments are spaced apart from each other and are staggered with respect to each other, and the two first handle-shaped segments are respectively connected to the corresponding first touching contact and the corresponding second touching contact.

4. The electrical connector according to claim 3, wherein each of the two second comb-like portions include a second comb-shaped segment and a second handle-shaped segment connected to the second comb-shaped segment, the two second comb-shaped segments are spaced apart from each other and are staggered with respect to each other, and the two second handle-shaped segments are respectively connected to the corresponding first touching contact and the corresponding second touching contact.

5. The electrical connector according to claim 4, wherein when the first layer-like capacitor and the second layer-like capacitor are orthogonally projected onto a board surface of the circuit board, projected regions formed by the two first comb-shaped segments are spaced apart from projected regions formed by the two second comb-shaped segments.

6. The electrical connector according to claim 4, wherein the circuit board includes a matching sheet coplanar with the second layer-like capacitor, the two second comb-shaped segments are entirely arranged inside of the matching sheet, and are not in contact with the matching sheet.

7. The electrical connector according to claim 6, wherein the matching sheet has two notches formed in an inner edge thereof, and wherein two of the fixing contacts respectively face toward the first touching contact and the second touching contact that are connected to the second layer-like capacitor, and are respectively arranged in the two notches of the matching sheet.

8. The electrical connector according to claim 6, wherein when the matching sheet and the conductive circuits are orthogonally projected onto a board surface of the circuit board, a projected region formed by the matching sheet overlaps at least 80% of a projected region formed by two of the conductive circuits that are respectively connected to the two first touching contacts.

9. The electrical connector according to claim 1, wherein the fixing contacts include two first fixing contacts arranged adjacent to each other and respectively facing toward the two first touching contacts along a longitudinal direction, a length of each of the first comb-like portions with respect to the longitudinal direction is 50-85% of a distance between each of the two first touching contacts and the corresponding first fixing contact.

10. The electrical connector according to claim 1, wherein the circuit board includes an insulating plate, and the first layer-like capacitor and the second layer-like capacitor are embedded in the insulating plate and are arranged on two different planes, and wherein the first layer-like capacitor and the third layer-like capacitor are arranged on the same plane, and the second layer-like capacitor and the fourth layer-like capacitor are arranged on the same plane.

11. The electrical connector according to claim 10, wherein when the first layer-like capacitor and the fourth layer-like capacitor are orthogonally projected onto a board surface of the circuit board, a projected region formed by the first layer-like capacitor overlaps a part of a projected region formed by the fourth layer-like capacitor.

12. The electrical connector according to claim 10, wherein when the second layer-like capacitor and the third layer-like capacitor are orthogonally projected onto a board surface of the circuit board, a projected region formed by the second layer-like capacitor overlaps a part of a projected region formed by the third layer-like capacitor.

13. The electrical connector according to claim 1, wherein the electrical connector is provided without any electronic component disposed on a board surface thereof.

14. The electrical connector according to claim 1, wherein the touching contacts are arranged in one row along a width direction, and each adjacent two of the touching contacts have the same gap, and wherein each of the touching contacts is in a tubular shape and penetrates through the circuit board so as to provide for insertion of the corresponding touching terminal.

15. The electrical connector according to claim 1, wherein the touching terminals are respectively inserted into and fixed in the touching contacts from a front side of the circuit board, and the fixing terminals are respectively inserted into and fixed in the fixing contacts from a rear side of the circuit board.

16. A circuit board of an electrical connector provided without any capacitor disposed on a board surface thereof, comprising:

a plurality of touching contacts arranged in one side portion of the circuit board, wherein the touching contacts include two first touching contacts for jointly transmitting a first differential signal and two second touching contacts for jointly transmitting a second differential signal, and wherein the two first touching contacts are arranged adjacent to each other, and the two second touching contacts are respectively arranged at two opposite outer sides of the two first touching contacts;

a plurality of fixing contacts arranged in another side portion of the circuit board;

a plurality of conductive circuits each having a first end and a second end opposite to the first end, wherein the first ends of the conductive circuits are respectively connected to the touching contacts, and the second ends of the conductive circuits are respectively connected to the fixing contacts;

a first layer-like capacitor embedded in the circuit board and having two first comb-like portions that are coplanar and are staggered with respect to each other, wherein one of the two first touching contacts and one of the two second touching contacts, which are arranged away from each other, are respectively and electrically coupled to the two first comb-like portions; and a second layer-like capacitor embedded in the circuit board and having two second comb-like portions that are coplanar and are staggered with respect to each other, wherein the other first touching contact and the other second touching contact, which are arranged away from each other, are respectively and electrically coupled to the two second comb-like portions, wherein the touching contacts include two third touching contacts for jointly transmitting a third differential signal and two fourth touching contacts for jointly transmitting a fourth differential signal, the two third touching contacts are arranged at an outer side of the two second touching contacts, and the two fourth touching contacts are arranged at another outer side of the two second touching contacts, and wherein the circuit board includes:

a third layer-like capacitor embedded in the circuit board and having two third comb-like portions that are coplanar and are staggered with respect to each other, wherein one of the two third touching contacts and one of the two second touching contacts, which are away from the two fourth touching contacts, are respectively and electrically coupled to the two third comb-like portions; and a fourth layer-like capacitor embedded in the circuit board and having two fourth comb-like portions that are coplanar and are staggered with respect to each other, wherein one of the two fourth touching contacts and the other second touching contact, which are away from the two third touching contacts, are respectively and electrically coupled to the two fourth comb-like portions.

17. The circuit board according to claim 16, wherein each of the two first comb-like portions include a first comb-shaped segment and a first handle-shaped segment connected to the first comb-shaped segment, the two first comb-shaped segments are spaced apart from each other and are staggered with respect to each other, and the two first handle-shaped segments are respectively connected to the corresponding first touching contact and the corresponding second touching contact, and wherein each of the two second comb-like portions include a second comb-shaped segment and a second handle-shaped segment connected to the second comb-shaped segment, the two second comb-shaped segments are spaced apart from each other and are staggered with respect to each other, and the two second handle-shaped segments are respectively connected to the corresponding first touching contact and the corresponding second touching contact.

18. The circuit board according to claim 17, wherein the circuit board includes a matching sheet coplanar with the second layer-like capacitor, and the two second comb-shaped segments are entirely arranged inside of the matching sheet and are not in contact with the matching sheet, and wherein the matching sheet has two notches formed in an inner edge thereof, two of the fixing contacts respectively face toward the first touching contact and the second touching contact that are connected to the second layer-like capacitor, and are respectively arranged in the two notches of the matching sheet.

19. The circuit board according to claim 16, wherein the fixing contacts include two first fixing contacts arranged adjacent to each other and respectively facing toward the two first touching contacts along a longitudinal direction, a length of each of the first comb-like portions with respect to the longitudinal direction is 50-85% of a distance between each of the two first touching contacts and the corresponding first fixing contact.

20. A circuit board of an electrical connector provided without any capacitor disposed on a board surface thereof, comprising:

a plurality of touching contacts arranged in one side portion of the circuit board, wherein the touching contacts include two first touching contacts for jointly transmitting a first differential signal and two second touching contacts for jointly transmitting a second differential signal, and wherein the two first touching contacts are arranged adjacent to each other, and the two second touching contacts are respectively arranged at two opposite outer sides of the two first touching contacts;

a plurality of fixing contacts arranged in another side portion of the circuit board;

a plurality of conductive circuits each having a first end and a second end opposite to the first end, wherein the first ends of the conductive circuits are respectively connected to the touching contacts, and the second ends of the conductive circuits are respectively connected to the fixing contacts;

a first layer-like capacitor embedded in the circuit board and having two first comb-like portions that are coplanar and are staggered with respect to each other, wherein one of the two first touching contacts and one of the two second touching contacts, which are arranged away from each other, are respectively and electrically coupled to the two first comb-like portions; and a second layer-like capacitor embedded in the circuit board and having two second comb-like portions that are coplanar and are staggered with respect to each other, wherein the other first touching contact and the other second touching contact, which are arranged away from each other, are respectively and electrically coupled to the two second comb-like portions, wherein each of the two first comb-like portions include a first comb-shaped segment and a first handle-shaped segment connected to the first comb-shaped segment, the two first comb-shaped segments are spaced apart from each other and are staggered with respect to each other, and the two first handle-shaped segments are respectively connected to the corresponding first touching contact and the corresponding second touching contact, and wherein each of the two second comb-like portions include a second comb-shaped segment and a second handle-shaped segment connected to the second comb-shaped segment, the two second comb-shaped segments are spaced apart from each other and are staggered with respect to each other, and the two second handle-shaped segments are respectively connected to the corresponding first touching contact and the corresponding second touching contact, wherein the circuit board includes a matching sheet coplanar with the second layer-like capacitor, and the two second comb-shaped segments are entirely arranged inside of the matching sheet and are not in contact with the matching sheet, and wherein the matching sheet has two notches formed in an inner edge thereof, two of the fixing contacts respectively face toward the first touching contact and the second touching contact that are connected to the second layer-like capacitor, and are respectively arranged in the two notches of the matching sheet.

* * * * *